(12) United States Patent
Preuschl et al.

(10) Patent No.: US 9,578,697 B2
(45) Date of Patent: Feb. 21, 2017

(54) LIGHTING MODULE

(71) Applicant: OSRAM GmbH, Munich (DE)

(72) Inventors: Thomas Preuschl, Sinzing (DE);
Hoetzl Guenter, Regensburg (DE);
Peter Sachsenweger, Zeitlarn (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 14/413,714

(22) PCT Filed: Jun. 28, 2013

(86) PCT No.: PCT/EP2013/063744
§ 371 (c)(1),
(2) Date: Jan. 9, 2015

(87) PCT Pub. No.: WO2014/009180
PCT Pub. Date: Jan. 16, 2014

(65) Prior Publication Data
US 2015/0195873 A1 Jul. 9, 2015

(30) Foreign Application Priority Data
Jul. 10, 2012 (DE) .......................... 10 2012 212 027

(51) Int. Cl.
*F21K 9/00* (2016.01)
*H05B 33/08* (2006.01)
(Continued)

(52) U.S. Cl.
CPC ............. *H05B 33/0803* (2013.01); *F21V 7/00* (2013.01); *F21V 19/003* (2013.01);
(Continued)

(58) Field of Classification Search
CPC ............ F21Y 2101/02; F21Y 2105/001; F21Y 2113/005; F21K 9/00; F21K 9/30; F21V 17/10; F21V 17/16; F21V 19/008; F21V 21/04
(Continued)

(56) References Cited

U.S. PATENT DOCUMENTS 8,029,159 B2 * 10/2011 Chen ....................... F21S 6/003
362/231
8,702,274 B2 4/2014 Breidenassel et al.
(Continued)

FOREIGN PATENT DOCUMENTS

DE 102009047493 A1 6/2011
DE 202011107787 U1 1/2012
(Continued)

OTHER PUBLICATIONS

International Search Report issued in PCT/EP2013/063744 on Aug. 29, 2013.
(Continued)

*Primary Examiner* — Haissa Philogene
(74) *Attorney, Agent, or Firm* — Viering, Jentschura & Partner mbB

(57) ABSTRACT

Various embodiments may relate to a lighting module, including a first printed circuit board, on which at least one light source is arranged, a covering element, which at least partially covers the first printed circuit board, and at least one electronic component, which is integrated in the covering element and is electrically connected to the first printed circuit board.

10 Claims, 2 Drawing Sheets

(51) Int. Cl.
*F21V 7/00* (2006.01)
*F21V 23/00* (2015.01)
*F21V 29/70* (2015.01)
*F21V 19/00* (2006.01)
*F21V 23/02* (2006.01)
*H05K 3/32* (2006.01)
*F21Y 101/00* (2016.01)

(52) U.S. Cl.
CPC ............ *F21V 23/006* (2013.01); *F21V 23/02* (2013.01); *F21V 29/70* (2015.01); *H05K 3/32* (2013.01); *F21Y 2101/00* (2013.01); *F21Y 2105/10* (2016.08); *F21Y 2115/10* (2016.08); *Y10T 29/49133* (2015.01)

(58) Field of Classification Search
USPC ............... 362/249.01, 249.02, 365, 374, 382
See application file for complete search history.

(56) References Cited

U.S. PATENT DOCUMENTS 8,894,254 B2 * 11/2014 Matsuda ................. F21S 8/026
362/249.02

2009/0295292 A1 12/2009 Harmgardt et al.
2015/0159816 A1* 6/2015 Preuschl ............... F21V 23/006
362/249.02

FOREIGN PATENT DOCUMENTS

| DE | 102010043140 A1 | 5/2012 |
| EP | 2455655 A2 | 5/2012 |
| EP | 2461094 A2 | 6/2012 |
| EP | 2642196 A1 | 9/2013 |
| JP | 2012074250 A | 4/2012 |
| WO | 2012055852 A1 | 5/2012 |

OTHER PUBLICATIONS

Office Action issued on Apr. 12, 2013 in the parallel German application No. 10 2012 212 027.0.
European Office Action based on Application No. 13 734 033.7(6 Pages) dated Feb. 11, 2016 (Reference Purpose Only).

* cited by examiner

LIGHTING MODULE

RELATED APPLICATIONS

The present application is a national stage entry according to 35 U.S.C. §371 of PCT application No.: PCT/EP2013/063744 filed on Jun. 28, 2013, which claims priority from German application No.: 10 2012 212 027.0 filed on Jul. 10, 2012, and is incorporated herein by reference in its entirety.

TECHNICAL FIELD

Various embodiments relate to a lighting module.

BACKGROUND

Lighting modules usually include a printed circuit board with one or more light sources arranged on the upper side thereof, and a covering element, which at least partially covers the printed circuit board. In addition, provision is generally made for the lighting modules to have an external driver or control gear, in which one or more electronic components which are required for operating the light sources on the printed circuit board are arranged. These one or more electronic components are connected to the printed circuit board having one or more light sources. A large amount of installation space is required for the lighting module, in particular in a lighting device, owing to such an external driver or such external control gear.

SUMMARY

Various embodiments provide a lighting module and a method for mounting a lighting module in which a more compact configuration of the lighting module can be achieved.

In various embodiments, a lighting module may have: a first printed circuit board, on which at least one light source is arranged, a covering element, which at least partially covers component, which is integrated in the covering element and is electrically connected to the first printed circuit board.

Such a lighting module has the advantage that the electronic component which is otherwise usually arranged in an additional driver or additional control gear is now integrated directly in the covering element, which at least partially covers the printed circuit board populated with the light source. In this case, integrated means that, for example, the electronic component is at least partially integrally formed on, formed in and/or embedded in the surface, in particular the inner surface, of the covering element and can therefore be considered to be part of the covering element. In particular, the electronic component is arranged on an inner surface of the covering element which points in the direction of the first printed circuit board in such a way that no air gap is formed between the inner surface of the covering element and the electronic component, and therefore the arrangement of the electronic component on the covering element is performed without any gaps. During manufacture of the covering element, therefore, the electronic component can be introduced directly as well or arranged in the covering element, for example. In this case, an undetachable connection between the covering element and the electronic component can be formed, for example. By virtue of the fact that the electronic component is integrated directly in the covering element, the electronic component can be arranged in the lighting module in a particularly space-saving manner, as a result of which the entire lighting module can have a more compact design and, as a result, requires less installation space than conventional lighting modules when installed in a lighting device, as a result of which a greater design freedom can also be achieved for the lighting device. In addition, the entire mounting process of the lighting module can thus also be substantially simplified for a user since the user only needs to connect the mains voltage in order to bring the lighting module into operation. One or more electronic components can be integrated in the covering element, wherein, in the case of a plurality of electronic components with the same function, electronic components with different powers can be combined with one another, which can all be integrated in the covering element, as a result of which the properties of the lighting module can be adjusted and matched individually.

The electronic component can be arranged on a second printed circuit board integrated in the covering element, wherein the electronic component can then be connected to the first printed circuit board via the second printed circuit board. The electronic component can thus be integrated in the covering element via the second printed circuit board. In the case of the arrangement of a plurality of electronic components, said electronic components can be combined easily and electrically connected easily to the first printed circuit board having the light source via only one connection by virtue of a second printed circuit board integrated in the covering element. As a result, it is not necessary for each electronic component to be connected individually to the first printed circuit board.

The second printed circuit board can be electrically connected to the first printed circuit board via a clamping contact and/or a spring contact and/or a soldered connection. A detachable connection can be formed by means of the clamping contact and the spring contact, wherein a plurality of clamping contacts and/or spring contacts can also be provided. An undetachable connection can be formed by means of the soldered connection. In the case of a detachable connection, in the event of a defect in the electronic component said electronic component can be replaced easily by removing the electronic component together with the covering element without needing to remove the entire lighting module. A soldered connection can be formed, for example, by virtue of the fact that a soldering lug formed on the second printed circuit board integrated in the covering element is soldered to the first printed circuit board having the light source. In order to achieve a particularly secure connection, the soldered connection can be formed at several points along the two printed circuit boards. In addition, alternative connection methods in addition to the clamping contact, spring contact and soldered connection are also possible, with which a secure electrical connection can be produced between the two printed circuit boards.

In order to integrate the second printed circuit board in the covering element, the second printed circuit board can be in the form of an injection-molded circuit carrier or in the form of a leadframe. In the case of an injection-molded circuit carrier, also referred to as molded interconnect device (MID), which can be formed so as to be three-dimensional, in contrast to a conventional printed circuit board, metallic conductor tracks are applied to injection-molded plastic carriers, with the result that a metalized plastic part is formed. The metallic conductor tracks for forming the second printed circuit board can therefore be introduced directly as well during production of the covering element, wherein this can take place, for example, by a two-component injection-molding method, a hot-stamping method, a mask exposure method or laser structuring, for example. The guidance and position of the conductor tracks on the covering element, in particular on the inner surface of the covering element, can in this case be matched individually to the requirements and is therefore freely selectable. The formation of the printed circuit board as an injection-molded circuit carrier is characterized by a high degree of freedom in respect of configuration and a reduction in the required installation space for the printed circuit board. In addition, the printed circuit board can in this case have any desired form, in particular a three-dimensional form, with the result that the printed circuit board can be matched individually to the form of the covering element. In addition, the number of mounting steps required can be reduced, as a result of which the manufacturing complexity and the manufacturing time can be reduced. In addition, injection-molded circuit carriers are characterized by increased environmental friendliness compared to conventional printed circuit boards. If the printed circuit board is formed from a leadframe, it can be formed from a metal strip in only one production step and easily integrated in the covering element, wherein the printed circuit board can also be matched to the form of the covering element individually in the case of a formation as a leadframe.

The electronic component is, for example, a capacitor, which in particular serves the purpose of smoothing supply voltages of the light source, filtering out electromagnetic interference and reducing noise development. In the case of the arrangement of a plurality of capacitors as electronic components in the covering element, the modulation behavior, i.e. the so-called flicker, of the light source can be adjusted, in particular reduced, by selecting the number of capacitors in a targeted manner. The electronic component can also have another function, in addition to the configuration as capacitor, however, for example in that it is in the form of a resistor.

If the electronic component is a capacitor, the capacitor is formed from a ceramic material, for example. In the case of the formation of the capacitor from a ceramic material, said capacitor can have a smaller design than a conventional electrolytic capacitor, as a result of which the capacitor requires less installation space and, as a result, the dimensions of the entire lighting module can be further reduced. However, it is also possible to use an electrolytic capacitor as capacitor, wherein, owing to the arrangement of the electrolytic capacitor in the covering element, the spacing with respect to the heat source can be increased in comparison with the arrangement in an external driver, as a result of which the life of the electrolytic capacitor can be extended in comparison with the arrangement in a conventional lighting module.

In order to prevent the covering element from being able to detach in an undesired manner from the first printed circuit board and, as a result, protection against electric shock no longer being provided by the covering element, the covering element can be connected detachably or undetachably to the printed circuit board. By virtue of the detachable or undetachable connection, the covering element can be fixedly connected to the first printed circuit board by a form-fitting and/or force-fitting and/or cohesive connection, wherein the connection can be formed, for example, by a clamping connection, an adhesive connection or a hot-caulking connection.

The light source can be, for example, a light-emitting diode (LED), wherein the light-emitting diode can also be an organic light-emitting diode (OLED). If more than one light source and therefore more than one light-emitting diode is arranged in the lighting module, the latter can be selected such that they emit light in the same color or in different colors.

A method for mounting a lighting module can be performed, for example, in such a way that at least one light source is arranged on a first printed circuit board, at least one electronic component is integrated in a covering element, and the covering element is positioned, together with the electronic component integrated therein, on the first printed circuit board in such a way that the covering element at least partially covers the first printed circuit board, wherein, when the covering element is positioned on the first printed circuit board, the electronic component is electrically connected to the first printed circuit board.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the detailed description below, reference is made to the attached drawings which form part of this description and in which, for illustrative purposes, a specific embodiment is shown in which the disclosure can be implemented. In this respect, directional terminology such as, for example, "at the top", "at the bottom", "at the front", "at the rear", "front", "rear", etc. is used with reference to the orientation of the figure(s) described. Since components of embodiments can be positioned in a number of different orientations, the directional terminology is used for illustrative purposes and is in no way restrictive. It goes without saying that other embodiments can be used and structural or logical amendments made without departing from the scope of protection of the present disclosure. The detailed description below should not be interpreted in a restrictive sense, and the scope of protection of the present disclosure is defined by the attached claims.

Within the scope of this description, the terms "connected" and "integrated" are used for describing both a direct and an indirect connection and a direct or indirect integration. Identical or similar elements have been provided with identical reference symbols in the figures, insofar as this is expedient.

Figure 1:
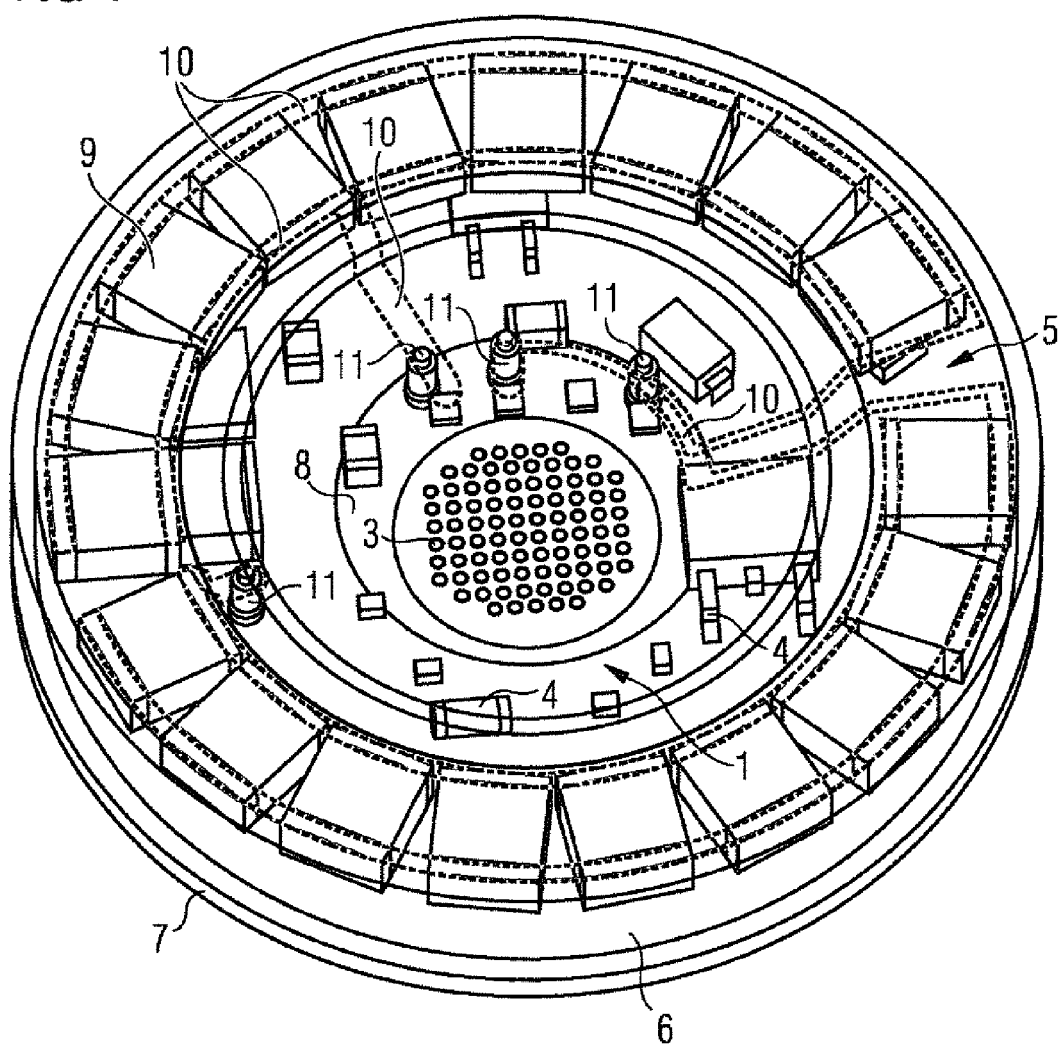
FIG. 1 shows a schematic illustration of a lighting module.
Figure 2:
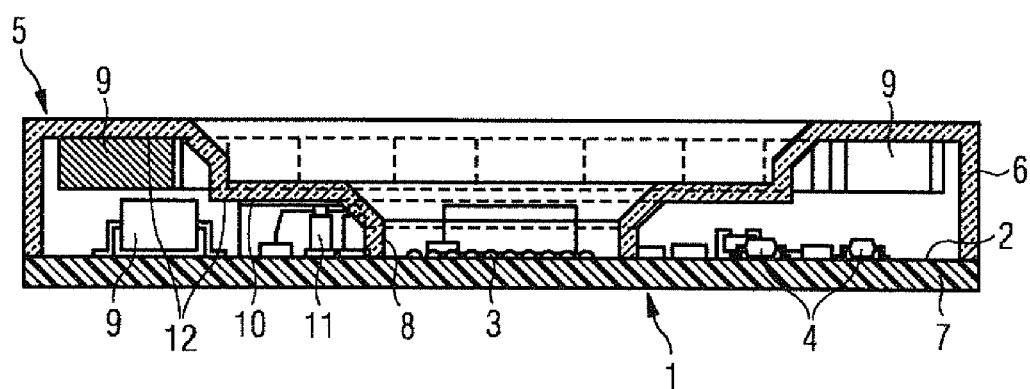
FIG. 2 shows a schematic sectional illustration of the lighting module shown in FIG. 1.

FIGS. 1 and 2 show a lighting module which has a first printed circuit board 1 which is substantially in the form of a circular disk and which is populated on its upper side 2 with a plurality of light sources 3 in the form of light-emitting diodes. The light sources 3 are arranged compactly centrally on the printed circuit board 1, with a uniform spacing with respect to one another. In addition, a plurality of electronic component parts 4 is arranged on the upper side 2 of the first printed circuit board 1. The electronic component parts 4 can be in the form of SMD components (SMD=surface-mounted device), which are soldered directly to the printed circuit board 1 by solderable connection areas. The electronic component parts 4 are arranged around the light sources 3. The first printed circuit board 1 forms, with the light sources 3 and the electronic component parts 4, a so-called "light engine".

In addition, the lighting module has a ring-shaped covering element 5, which is in the form of a hood and is positioned on the first printed circuit board 1, with the result that the outer circumferential surface 6 of the covering element 5 terminates flush with the outer edge 7 of the first printed circuit board 1. The covering element 5 is formed in such a way that it covers the electronic component parts 4 on the first printed circuit board 1, but the covering element 5 does not cover the first printed circuit board 1 in the region of the light sources 3, but the covering element 5 has a clearance which is bounded by an outwardly directed inner circumferential surface 8. Therefore, the covering element 5 covers the first printed circuit board 1 between its circular outer circumferential surface 6 and its circular inner circumferential surface 8, wherein the covering element 5 rests both with its outer circumferential surface 6 and with its inner circumferential surface 8 on the upper side 2 of the first printed circuit board 1.

A plurality of electronic components 9, which are capacitors formed from a ceramic material, for example, which are in the form of electrolytic capacitors in the case of conventional lighting modules and are arranged in an external driver or external control gear, are integrated in the covering element 5. In the embodiment shown here, eighteen electronic components 9 are integrated in the covering element 5, wherein the electronic components 9 are arranged in the form of a circular ring on an inner surface 12 of the covering element 5 which points in the direction of the first printed circuit board 1, as can be seen from FIG. 1. The electronic components 9 in the form of ceramic capacitors serve in particular the purpose of smoothing supply voltages of the light sources 3, filtering out electromagnetic interference and reducing noise development. The electronic components 9 are electrically connected to the first printed circuit board 1 via a second printed circuit board 10, which is three-dimensional in this case, in the form of an injection-molded circuit carrier (MID) with a plurality of metallic conductor tracks in the covering element 5. The metallic conductor tracks of the second printed circuit board 10 are formed so as to be individually distributed on the inner surface 12 of the covering element 5 which points in the direction of the first printed circuit board 1. The position of the conductor tracks can be selected individually so as to be able to form an electrical connection, with a position which is as favorable as possible, to the first printed circuit board 1. The electrical connection between the conductor tracks of the second printed circuit board 10 and the first printed circuit board 1 is made via soldering pins 11 in the case of the embodiment shown here, which soldering pins 11 are soldered to the upper side 2 of the first printed circuit board 1 and the conductor tracks of the second printed circuit board 10. When mounting the lighting module, the electronic components can therefore be connected directly when the covering element 5 is positioned on the first printed circuit board 1, with the result that this can take place in one manufacturing step.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting module, comprising
 a first printed circuit board, on which at least one light source is arranged,
  a covering element, which at least partially covers the first printed circuit board, and
  at least one electronic component, which is integrated in the covering element, is electrically connected to the first printed circuit board,
 wherein the electronic component is arranged on a second printed circuit board, which is integrated in the covering element, wherein the electronic component is electrically connected to the first printed circuit board via the second printed circuit board.

2. The lighting module as claimed in claim 1, wherein the light source is a light-emitting diode.

3. The lighting module as claimed in claim 1, wherein the second printed circuit board is connected to the first printed circuit board via a clamping contact and/or a spring contact and/or a soldered connection.

4. The lighting module as claimed in claim 1, wherein the second printed circuit board is in the form of an injection-molded circuit carrier or in the form of a leadframe.

5. The lighting module as claimed in claim 1, wherein the electronic component is a capacitor.

6. The lighting module as claimed in claim 5, wherein the electronic component in the form of the capacitor is formed from a ceramic material.

7. The lighting module as claimed in claim 1, wherein the covering element is connected detachably to the first printed circuit board.

8. The lighting module as claimed in claim 1, wherein the covering element is connected undetachably to the first printed circuit board.

9. The lighting module as claimed in claim 3, wherein the second printed circuit board is in the form of an injection-molded circuit carrier or in the form of a leadframe.

10. A method for mounting a lighting module, the method comprising:
 arranging at least one light source on a first printed circuit board,
 arranging at least one electronic component onto a second printed circuit board,
 integrating the second printed circuit board in a covering element, and
 positioning the covering element together with the electronic component and the second printed circuit board integrated therein, on the first printed circuit board in such a way that the covering element at least partially covers the first printed circuit board, wherein, when the covering element is positioned on the first printed circuit board, the electronic component is electrically connected to the first printed circuit board via the second printed circuit board.

* * * * *

UNITED STATES PATENT AND TRADEMARK OFFICE
CERTIFICATE OF CORRECTION

PATENT NO. : 9,578,697 B2
APPLICATION NO. : 14/413714
DATED : February 21, 2017
INVENTOR(S) : Thomas Preuschl et al.

It is certified that error appears in the above-identified patent and that said Letters Patent is hereby corrected as shown below:

In the Specification

Column 1, Line 40: Please add "the first printed circuit board, and at least one electronic" between the words "covers" and "component".

Signed and Sealed this
Eleventh Day of April, 2017

Michelle K. Lee
*Director of the United States Patent and Trademark Office*